(12) United States Patent
Kim et al.

(10) Patent No.: US 10,910,585 B2
(45) Date of Patent: Feb. 2, 2021

(54) OLED LIGHTING APPARATUS HAVING A DOUBLE LAYERED ELECTRODE

(71) Applicant: LG DISPLAY CO., LTD., Seoul (KR)

(72) Inventors: Jongmin Kim, Pyeongtaek-si (KR); Taejoon Song, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/203,010

(22) Filed: Nov. 28, 2018

(65) Prior Publication Data

US 2019/0165303 A1    May 30, 2019

(30) Foreign Application Priority Data

Nov. 28, 2017  (KR) .................. 10-2017-0160121

(51) Int. Cl.
*H01L 51/52* (2006.01)
*H01L 51/56* (2006.01)
*H01L 51/50* (2006.01)

(52) U.S. Cl.
CPC ...... *H01L 51/5212* (2013.01); *H01L 51/5012* (2013.01); *H01L 51/5221* (2013.01); *H01L 51/5237* (2013.01); *H01L 51/5268* (2013.01); *H01L 51/56* (2013.01); *H01L 2251/5392* (2013.01)

(58) Field of Classification Search
CPC . H01L 51/5212; H01L 51/5237; H01L 51/56; H01L 51/5221; H01L 51/5268; H01L 51/5012; H01L 51/5215; H01L 2251/5392; H01L 51/5253–5256
See application file for complete search history.

(56) References Cited

U.S. PATENT DOCUMENTS

| | | | |
|---|---|---|---|
| 8,772,820 B2 | 7/2014 | Yoshizumi et al. | |
| 9,680,123 B2 | 6/2017 | Chen et al. | |
| 2005/0077816 A1 | 4/2005 | Yamada et al. | |
| 2012/0248489 A1 | 10/2012 | Yoshizumi et al. | |
| 2014/0021463 A1* | 1/2014 | Nakamura | H01L 51/5209 257/40 |
| 2014/0353655 A1 | 12/2014 | Kim | |
| 2017/0018741 A1* | 1/2017 | Osawa | H01L 51/5268 |

(Continued)

FOREIGN PATENT DOCUMENTS

| | | |
|---|---|---|
| CN | 105702375 A | 4/2013 |
| KR | 10-2010-0105431 A1 | 9/2010 |

(Continued)

*Primary Examiner* — Laura M Menz
*Assistant Examiner* — Candice Chan
(74) *Attorney, Agent, or Firm* — Birch, Stewart, Kolasch & Birch, LLP

(57) ABSTRACT

Discussed is an organic light emitting diode (OLED) lighting apparatus including a substrate; an auxiliary wiring disposed on the substrate; a protective layer configured to cover the auxiliary wiring; a first electrode disposed between the auxiliary wiring and the protective layer to be in direct contact with the auxiliary wiring, the first electrode including a first layer and a second layer, the first layer having a first resistance, and the second layer being configured to cover the first layer and the protective layer and having a second resistance higher than the first resistance; an organic light emitting layer disposed on the first electrode; and a second electrode disposed on the organic light emitting layer.

12 Claims, 7 Drawing Sheets

(56) References Cited

U.S. PATENT DOCUMENTS

| | | |
|---|---|---|
| 2017/0194387 A1 | 7/2017 | Oh et al. |
| 2019/0019975 A1* | 1/2019 | Song .................... G09G 3/3233 |
| 2019/0019980 A1* | 1/2019 | Song ..................... H01L 51/56 |
| 2019/0165319 A1* | 5/2019 | Kim ..................... H01L 27/329 |

FOREIGN PATENT DOCUMENTS

| | | |
|---|---|---|
| KR | 10-2012-0123982 A | 11/2012 |
| KR | 10-2013-0033093 A | 4/2013 |
| KR | 10-2014-0080231 A | 6/2014 |

\* cited by examiner

OLED LIGHTING APPARATUS HAVING A DOUBLE LAYERED ELECTRODE

CROSS-REFERENCE TO RELATED APPLICATION

This application claims priority under 35 U.S.C. § 119 to Korean Application No. 10-2017-0160121, filed in the Republic of Korea on Nov. 28, 2017, which is hereby incorporated by reference in its entirety for all purposes as if fully set forth herein.

BACKGROUND OF THE INVENTION

1. Field of the Invention

The present disclosure relates to an organic light emitting diode (OLED) lighting apparatus, and more particularly, to an OLED lighting apparatus capable of preventing a defect caused by step coverage of an electrode and improving an aperture ratio.

2. Description of Related Art

Currently, a fluorescent lamp or an incandescent lamp is mainly used as a lighting apparatus. The incandescent lamp has very low energy efficiency, despite a high color rendering index, and the fluorescent lamp has a low color rendering index and contains mercury which causes environmental pollution, despite excellent energy efficiency.

Accordingly, a light emitting diode (LED) has been proposed as a lighting apparatus which may replace the fluorescent lamp or incandescent lamp. Such a LED is made of an inorganic light emitting material, and light emission efficiency thereof has a maximum value in a blue wavelength band and reductions toward a red wavelength band and a green wavelength band, which has the highest luminosity factor. Accordingly, a method of obtaining white light by combining a red LED, a green LED and a blue LED exhibits a decrease in light emission efficiency. Such a method also exhibits a decrease in color rendering properties due to a narrow width of an emission peak of each LED.

In order to overcome such problems, there has been proposed a lighting apparatus configured to emit white light through a combination of the blue LED and a yellow phosphor instead of combining the red, green and blue LED. This is because it is more efficient to use the blue LED having higher light emission efficiency than the green LED, and for the other colors to use a fluorescent material that receives blue light to emit yellow light.

However, the lighting apparatus configured to emit white light by combining the blue LED with the yellow phosphor has a limitation in improving the light emission efficiency because the fluorescent material that emits yellow light has poor light emission efficiency.

In order to solve a decrease in the light emission efficiency, there has been proposed an OLED lighting apparatus using an OLED made of an organic light emitting material. Generally, the OLED has relatively excellent light emission efficiency in the green and red wavelength areas in comparison to an inorganic light emitting diode. In addition, the OLED exhibits improved color rendering properties due to a relatively wide emission peak in the blue, red, and green wavelength areas in comparison to the inorganic light emitting diode. As a result, light produced from the lighting apparatus including the OLED is more similar to sunlight.

The OLED includes an anode, a cathode, and an organic light emitting layer disposed between the anode and the cathode. Here, since a distance between the anode and the cathode is narrow, the OLED for a lighting apparatus is vulnerable to a pinhole due to penetration of a foreign substance. In addition, the anode is likely to be in direct contact with the cathode due to a generation of cracks, a stepped internal structure of the OLED, and roughness of stacked layers, causing a short circuit between the anode and the cathode. Further, a short circuit between the anode and the cathode may also occur when the organic light emitting layer is formed to be thinner than a predetermined thickness due to a process failure or a process error during formation of the organic light emitting layer.

In the lighting apparatus, when a short circuit occurs between the anode and the cathode, a short circuit area forms a low resistance current path. As a result, current flows only in the short circuit area and little or no current flows through other areas of the OLED, thereby causing a reduction in an emission output of the OLED or an emission failure of the OLED.

As a result, light from the lighting apparatus has a luminance below a predetermined value, causing deterioration in quality of the lighting apparatus or failure of the lighting apparatus. In addition, pixels corresponding to the short circuit area become defective pixels, causing a decrease in the quality of the lighting apparatus.

SUMMARY OF THE INVENTION

Embodiments of the present disclosure provide an organic light emitting diode (OLED) lighting apparatus capable of preventing a defect caused by step coverage of an electrode and improving an aperture ratio.

For this purpose, a first electrode having a double-layered structure has been introduced to the OLED lighting apparatus according to embodiments of the present disclosure. A first layer of the first electrode can be made of a transparent conductive material having low resistance to generate a current path, and a second layer of the first electrode can be disposed on a protective layer configured to cover an auxiliary wiring and the first layer of the first electrode and be made of a transparent conductive material having high resistance.

As a result, the first layer of the first electrode made of a transparent conductive material having low resistance can be disposed under the protective layer, and thus film quality characteristics may remain unchanged. Besides, the OLED lighting apparatus according to embodiments of the present disclosure may implement a function of preventing a short circuit by means of the second layer of the first electrode having high resistance disposed on the first layer of the first electrode and the protective layer, and thus it is not necessary to design an additional short circuit preventing resistance circuit, thereby improving an aperture ratio.

Further, the OLED light apparatus according to embodiments of the present disclosure may completely remove or compensate a step coverage caused by the auxiliary wiring since the second layer of the first electrode is coated so as to completely cover entire upper portions of the first layer of the first electrode and the protective layer and has a flat surface, thereby preventing a disconnection malfunction of the organic light emitting layer and the second electrode caused by the step coverage.

The OLED lighting apparatus according to embodiments of the present disclosure may include an auxiliary wiring disposed on a substrate, a protective layer configured to cover the auxiliary wiring, a first layer disposed between the auxiliary wiring and the protective layer to be in direct contact with the auxiliary wiring and having a first resistance, and a second layer configured to cover the first layer and the protective layer and having a second resistance higher than the first resistance.

In other words, the first electrode having a double-layered structure has been introduced to the OLED lighting apparatus according to embodiments of the present disclosure. The first layer of the first electrode can be made of a transparent conductive material having low resistance to generate a current path, and the second layer of the first electrode can be disposed on the protective layer configured to cover the auxiliary wiring and the first layer of the first electrode and can be made of a transparent conductive material having high resistance.

As a result, since the first layer of the first electrode is made of a transparent metal material different from that of the protective layer, there is no fear of damage to the first layer of the first electrode during a process of forming the protective layer. Even though the first layer of the first electrode is damaged, the damage may not cause a change in film quality characteristics, thereby improving the reliability of the OLED lighting apparatus.

Further, the first layer of the first electrode made of a transparent conductive material having low resistance can be disposed under the protective layer, and thus film quality characteristics may remain unchanged. Besides, the OLED lighting apparatus according to embodiments of the present disclosure may implement a function of preventing a short circuit by means of the second layer of the first electrode having high resistance disposed on the first layer of the first electrode and the protective layer, and thus it is not necessary to design an additional short circuit preventing circuit, thereby improving an aperture ratio.

Furthermore, the OLED light apparatus according to embodiments of the present disclosure may completely remove or compensate a step coverage caused by the auxiliary wiring since the second layer of the first electrode is coated so as to completely cover entire upper portions of the first layer of the first electrode and the protective layer and has a flat surface, thereby preventing a disconnection malfunction of the organic light emitting layer and the second electrode caused by the step coverage.

In the OLED lighting apparatus according to embodiments of the present disclosure, the first layer of the first electrode made of a transparent conductive material having a low resistance value of approximately 10 to 700Ω can be disposed between the auxiliary wiring and the protective layer. Since the transparent conductive material constituting the first layer is different from that of the protective layer, there is no fear of damage to the first layer of the first electrode during a process of forming the protective layer. Even though the first layer of the first electrode is damaged, the damage may not cause a change in film quality characteristics, thereby improving the reliability of the OLED lighting apparatus.

Further, since the second layer of first electrode made of a high resistive film having a high resistance value of approximately 5,000 to 30,000Ω can be disposed on the first layer of the first electrode and the protective layer, the sum of the first resistance and the second resistance can be adjusted to approximately 1,000 to 20,000Ω. As a result, the OLED lighting apparatus according to embodiments of the present disclosure may prevent a sharp decrease in a luminance due to a short circuit of a pixel without forming an opening and a resistive pattern in the first electrode, thereby preventing an increase in cost or a reduction in yield resulting from the addition of a process.

The first layer of the first electrode made of a transparent conductive material having low resistance can be disposed under the protective layer, and thus film quality characteristics may remain unchanged. Besides, the OLED lighting apparatus according to embodiments of the present disclosure may implement a function of preventing a short circuit by means of the second layer of the first electrode having high resistance disposed on the first layer of the first electrode and the protective layer, and thus it is not necessary to design an additional short circuit preventing circuit, thereby improving an aperture ratio.

Furthermore, the OLED light apparatus according to embodiments of the present disclosure may completely remove a step coverage caused by the auxiliary wiring since the second layer of the first electrode is coated so as to completely cover entire upper portions of the first layer of the first electrode and the protective layer and has a flat surface, thereby preventing a disconnection malfunction of the organic light emitting layer and the second electrode caused by the step coverage.

In addition, the OLED light apparatus according to embodiments of the present disclosure may further include a light extracting layer disposed on a rear surface of the substrate in contact with an external air layer to minimize light reflection occurring at a surface boundary between the substrate and the external air layer, thereby improving light extraction efficiency.

DETAILED DESCRIPTION OF THE EMBODIMENTS

Figure 1:
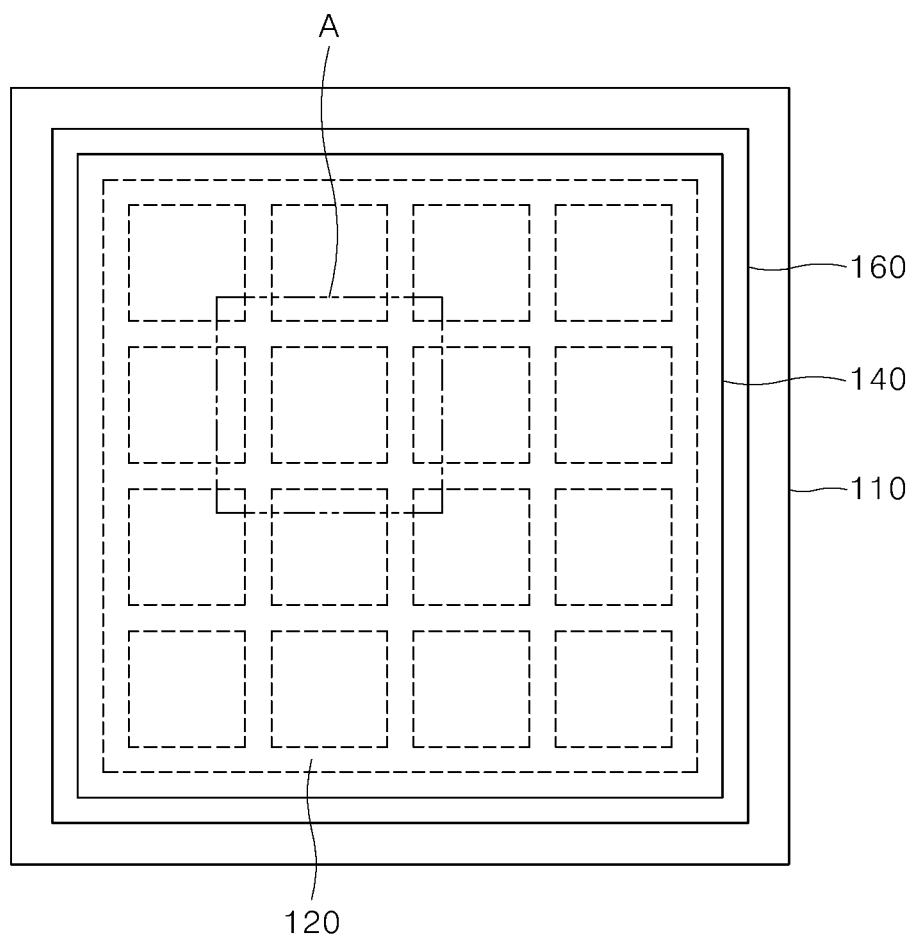
FIG. 1 is a plan view of an OLED lighting apparatus according to a first embodiment of the present disclosure.

The aforementioned objects, features and advantages will be described in detail with reference to the accompanying drawings, such that those skilled in the art can easily carry out a technical idea of the present disclosure. In the description of the embodiments, the detailed description of well-known related configurations or functions will be omitted when it is deemed that such description will cause ambiguous interpretation of the present disclosure. Hereinafter, preferred embodiments of the present disclosure will be described in detail with reference to the accompanying drawings. In the drawings, same reference numerals designate same or like elements.

Hereinafter, an organic light emitting diode (OLED) lighting apparatus according to preferred embodiments of the present disclosure will be described in detail with reference to the accompanying drawings.

Figure 2:
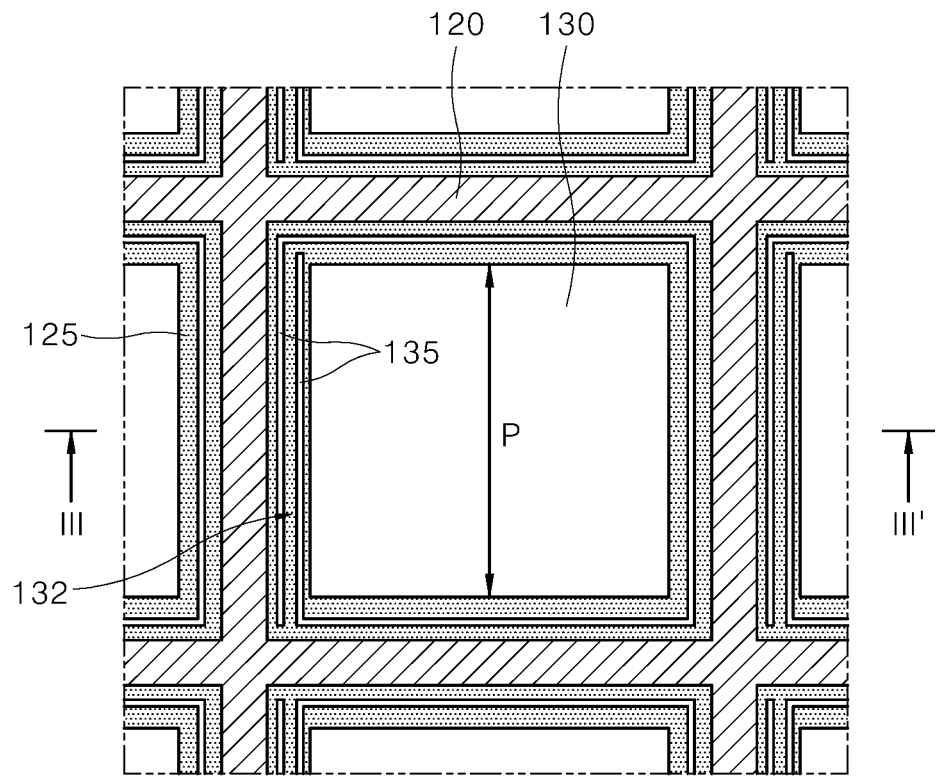
FIG. 2 is an enlarged cross-sectional view of the portion A of FIG. 1.
Figure 3:
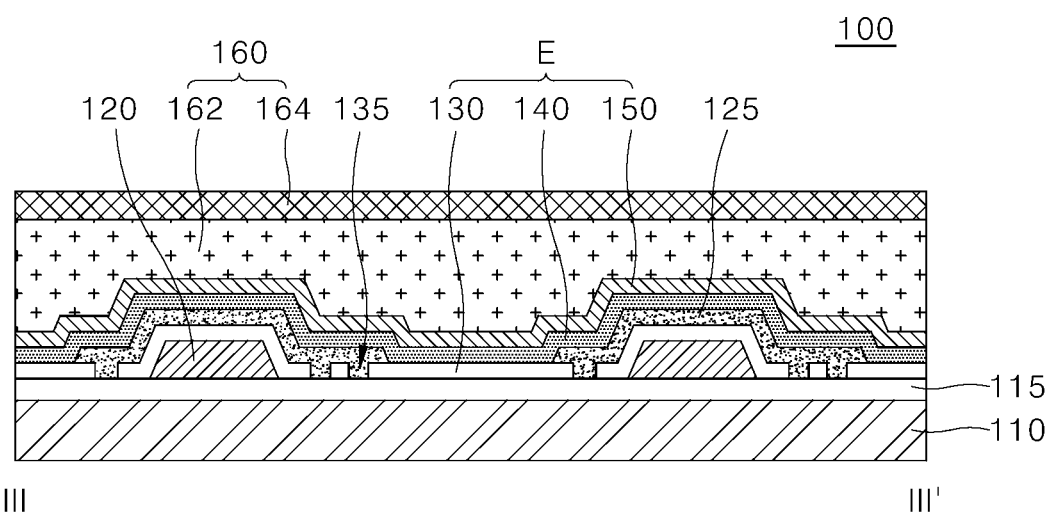
FIG. 3 is a cross-sectional view taken along line III-III' of FIG. 2.

FIG. 1 is a plan view of an OLED lighting apparatus according to a first embodiment of the present disclosure. FIG. 2 is an enlarged cross-sectional view of the portion A of FIG. 1. FIG. 3 is a cross-sectional view taken along line of FIG. 2. All the components of the OLED lighting apparatus according to all embodiments of the present disclosure are operatively coupled and configured. Although discussed in terms of an organic light emitting diode (OLED) lighting apparatus, all embodiments of the present disclosure can be applied to any lighting apparatus, including an inorganic light emitting diode lighting apparatus.

Referring to FIGS. 1 to 3, an OLED lighting apparatus 100 according to the first embodiment of the present disclosure may include a substrate 110, a buffer layer 115 disposed on the substrate 110, and an OLED E disposed on the buffer layer 115.

The OLED E may include a first electrode 130 disposed on the buffer layer 115, an organic light emitting layer 140 disposed on the first electrode 130, and a second electrode 150 disposed on the organic light emitting layer 140. In the OLED lighting apparatus 100 having such a structure, the organic light emitting layer 140 may emit light when a signal can be applied to the first electrode 130 and the second electrode 150 of the OLED E, whereby light emission over the entire substrate 110 can be achieved.

At this time, an auxiliary wiring 120 can be arranged in a matrix form on the substrate 110. The auxiliary wiring 120 can be made of a metal material having excellent conductivity to allow uniform voltage to be applied to the first electrode 130 disposed over the entire substrate 110, whereby the OLED lighting apparatus 100 may emit light with uniform luminance even when implemented as a large lighting apparatus. The auxiliary wiring 120 can be disposed between the buffer layer 115 and the first electrode 130 to be in direct contact with the first electrode 130.

The first electrode 130 can be made of a transparent conductive material such as indium tin oxide (ITO), and advantageously transmit emitted light therethrough. However, the first electrode 130 can have a very high electrical resistance in comparison to the metal material. Accordingly, when the OLED lighting apparatus 100 is implemented as a large-area lighting apparatus, a current applied to a wide area may not be uniform due to high resistance of the transparent conductive material. Such non-uniform current distribution may make it difficult for the large OLED lighting apparatus 100 to emit light with a uniform luminance.

The auxiliary wiring 120 can be arranged in a matrix form over the entire substrate 110 to allow a uniform voltage to be applied to the first electrode 130 disposed over the entire substrate 110, whereby the large OLED lighting apparatus 100 may emit light with a uniform luminance. For this purpose, the auxiliary wiring 120 can be made of any one selected from Al, Au, Cu, Ti, W, Mo and Cr, or alloys thereof. The auxiliary wiring 120 can have a single-layered structure or a multi-layered structure.

The substrate 110 can be divided into a plurality of pixels P by the auxiliary wiring 120 arranged in a matrix form. Since the auxiliary wiring 120 can have a much lower resistance than the first electrode 130, a voltage for the first electrode 130 can be applied to the first electrode 130 through the auxiliary wiring 120 rather than being directly applied to the first electrode 130. In this way, the first electrode 130 formed over the entire substrate 110 can be divided into the plurality of pixels P by the auxiliary wiring 120.

A protective layer 125 can be disposed on the first electrode 130 so as to cover the auxiliary wiring 120. Since the auxiliary wiring 120 can be made of an opaque metal, no light can be emitted from an area where the auxiliary wiring 120 can be formed. Therefore, the protective layer 125 can be provided only on portions of an upper surface of the first electrode, under which the auxiliary wiring 120 disposed, whereby light can be emitted only from light emitting areas of the pixels P.

In addition, the protective layer 125 can be formed to surround the auxiliary wiring 120. The protective layer 125 can be made of an inorganic material such as SiOx or SiNx. Alternatively, the protective layer 125 can be made of an organic material such as photoacryl, or can be composed of a plurality of layers including an inorganic layer and an organic layer.

The organic light emitting layer 140 and the second electrode 150 can be sequentially disposed on the first electrode 130 and the protective layer 125.

The organic light emitting layer 140 can be made of an organic light emitting material that emits white light. For example, the organic light emitting layer 140 can be composed of a blue organic light emitting layer, a red organic light emitting layer, and a green organic light emitting layer. Alternatively, the organic light emitting layer 140 can have a tandem structure including a blue light emitting layer and a yellow-green light emitting layer. However, it should be understood that the organic light emitting layer 140 according to embodiments of the present disclosure is not limited thereto and can be configured in various forms and include other variations.

The OLED E may further include: an electron injection layer and a hole injection layer which inject electrons and holes into the organic light emitting layer 140, respectively; an electron transport layer and a hole transport layer which transport injected electrons and holes to the organic light emitting layer 140, respectively; and a charge generation layer which generates charges such as electrons and holes.

The organic light emitting layer 140 can be made of a material that emits light in a visible light area by receiving holes and electrons from the hole transporting layer and the electron transporting layer, respectively and combining them. In this instance, an organic material having excellent quantum efficiency for fluorescence or phosphorescence can be used. The organic material can be, for example, a 8-hydroxy-quinoline aluminum complex (Alq3), a carbazole-based compound, a dimerized styryl compound, a bis-methyl-8-hydroxyquinoline paraphenylphenol aluminum complex (Balq), a 10-hydroxybenzoquinoline-metal compound, benzoxazole, benzthiazole and benzimidazole-based compounds, an anthracene-based compound, a pyrene-based compound, a poly(p-phenylenevinylene) (PPV)-based polymer, a spiro compound, polyfluorene, and lubrene, but is not limited thereto and includes other variations.

The second electrode 150 can be made of metal such as Ca, Ba, Mg, Al, or Ag, or an alloy thereof.

The first electrode 130, the organic light emitting layer 140, and the second electrode 150 may constitute the OLED E. Here, when voltage is applied to the first electrode 130 which can be an anode of the OLED E and the second electrode 150 which can be a cathode of the OLED E, an electron and a hole can be respectively injected from the second electrode 150 and the first electrode 130 into the organic light emitting layer 140 to generate an exciton in the organic light emitting layer 140. As the exciton decays, light corresponding to an energy difference between a lowest unoccupied molecular orbital (LUMO) and a highest occupied molecular orbital (HOMO) of the organic light emitting layer 140 can be generated and emitted toward the substrate 110.

In addition, the OLED lighting apparatus 100 according to the first embodiment of the present disclosure may further include an encapsulation layer 160 disposed so as to cover the second electrode 150 disposed on the substrate 110 provided with the OLED E.

The encapsulation layer 160 may include an adhesive layer 162 and a base layer 164 disposed on the adhesive layer 162. In this way, the encapsulation layer 160 can be disposed on the substrate 110 provided with the OLED E, and the base layer 164 can be adhered to the OLED E by the adhesive layer 162, and thereby it is possible to seal the OLED lighting apparatus 100.

At this time, a photocurable adhesive or a thermosetting adhesive can be used as the adhesive layer 162. The base layer 164 arranged to prevent moisture or air from permeating from the outside can be made of any material as long as it is able to perform a function of preventing permeation of moisture or air. For example, the base layer 164 can be made of a polymer material such as polyethyleneterephtalate (PET), or a metal material such as an aluminum foil, a Fe—Ni alloy, a Fe—Ni—Co alloy, or the like.

Referring to FIGS. 2 and 3, in the OLED lighting apparatus 100 according to the first embodiment, the first electrode 130 can be disposed within the pixel P defined by the auxiliary wiring 120 arranged in a matrix form, and the auxiliary wiring 120 can be electrically connected to the first electrode 130 through a resistive pattern 132 having a relatively high resistance.

Accordingly, in the OLED lighting apparatus 100 according to the first embodiment, a signal applied to the auxiliary wire 120 can be applied to the first electrode 130 via the resistive pattern 132. Thus, it is possible to secure a sufficiently long signal path when an opening 135 of the first electrode 130 can be disposed to surround edges of the pixel P such that the resistive pattern 132 can be sufficiently long. As a result, it is possible to create a short circuit preventing resistance having a desired magnitude through a design change applied to the opening 135 of the first electrode 130.

In this way, the opening 135 can be formed by partially removing the first electrode 130 disposed over the auxiliary wiring 120 and the substrate 110, whereby the resistive pattern 132 made of the same material as the first electrode 130 can be formed.

However, in the OLED lighting apparatus 100 according to the first embodiment, light may not be emitted from areas in which the auxiliary wire 120, the opening 135 of the first electrode 130, and the resistive pattern 132 are disposed, and thus these areas can be covered with the protective film 125, thereby causing a reduction in an overall aperture ratio of the OLED lighting apparatus 100.

In particular, since the resistive pattern 132 can be required to have a predetermined width and length to obtain a predetermined resistance value, the resistive pattern 132 can be required to occupy a certain area within the pixel P, irrespective of the area of the pixel P. As a result, the aperture ratio of the OLED lighting apparatus 100 according to the first embodiment can be reduced in comparison to that of an OLED lighting apparatus which is not provided with the short circuit prevention resistance.

Therefore, when the OLED lighting apparatus 100 can be implemented as a high-resolution lighting apparatus having a small pixel size, the aperture ratio of the OLED lighting apparatus can be reduced below a predetermined value, thereby causing a quality failure of the OLED lighting apparatus 100.

In other words, when a short circuit preventing resistance is created by the opening 135 of the first electrode and the resistive pattern 132, the aperture ratio of the pixel P can be reduced, and thus it can be difficult to manufacture a high-resolution OLED lighting apparatus 100.

In order to solve this problem, in the OLED lighting apparatus according to the second embodiment of the present disclosure, a high resistive film having a high resistance value of 1,000 to 20,000$\Omega$ can be applied to the first electrode, whereby the opening of the first electrode and the resistive pattern can be removed and a short circuit preventing resistance may not be created. As a result, it is possible to solve a problem of a reduction in the aperture ratio.

The OLED lighting apparatus according to the second embodiment will be described in detail with reference to the accompanying drawings.

Figure 4:
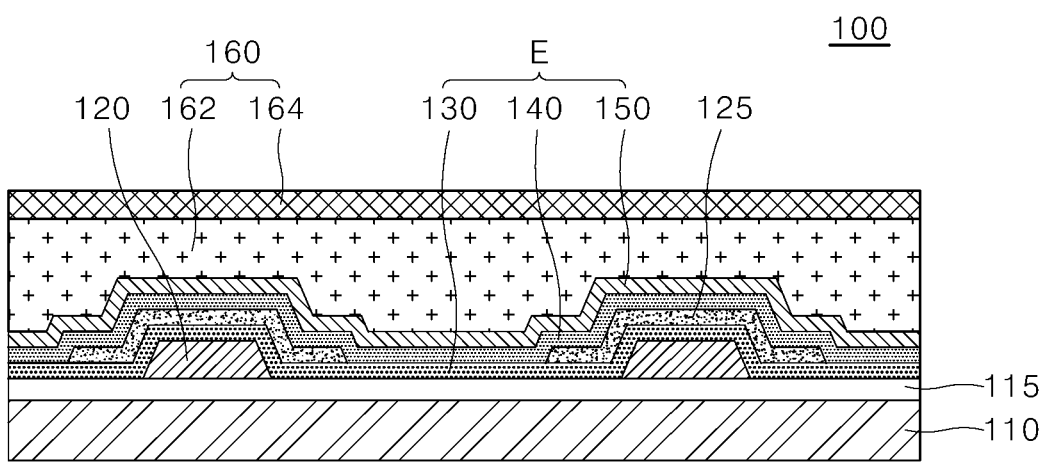
FIG. 4 is a cross-sectional view of an OLED lighting apparatus according to a second embodiment of the present disclosure.

FIG. 4 is a cross-sectional view of the OLED lighting apparatus according to the second embodiment of the present disclosure. In FIG. 4, the same reference numerals are given to substantially the same elements as in the first embodiment.

As shown in FIG. 4, the OLED lighting apparatus 100 according to the second embodiment of the present disclosure may include a substrate 100, a buffer layer 115 disposed on the substrate 110 and an auxiliary wiring 120 disposed on the buffer layer 115.

A first electrode 130 made of a high resistive film having a high resistance value of 1,000 to 20,000$\Omega$ can be disposed on the buffer layer 115 on which the auxiliary wiring 120 can be disposed, and a protective layer 125 can be disposed on the first electrode 130 so as to cover the auxiliary wiring 120.

An organic light emitting layer 140 and a second electrode 150 can be sequentially stacked on the protective layer 125 and the first electrode 130, and the encapsulation layer 160 can be disposed on the second electrode 150.

The OLED lighting apparatus 100 according to the second embodiment may use the high resistive film having a high resistance value of 1,000 to 20,000$\Omega$ as the first electrode 130 disposed between the auxiliary wiring 120 and the protective layer 125, thereby preventing a sharp decrease in the luminance due to a short circuit between the first electrode 130 and the second electrode 150 without creating an additional short circuit prevent resistance.

For this purpose, the first electrode 130 may include a binder and a conductive material.

The binder may include at least one selected from tetraethlyorthosilicate (TEOS), silsesquioxane (SSQ), and polysiloxane.

The conductive material may include at least one selected from poly(3,4-ethylenedioxythiophene) (PEDOT), a carbon nanotube (CNT), graphene, a Cu nanowire, an Ag nanowire and an Au nanowire.

At this time, the first electrode 130 may secure a high resistance having a value of 1,000 to 20,000$\Omega$ by controlling an amount of the conductive material to be added to the binder in an optimum content ratio.

As shown in FIGS. 2 and 3, the first electrode 130 can be made of a material having relatively good conductivity such as ITO, and thus can have a resistance value of about 20$\Omega$.

Also, the second electrode 150 made of metal can have a resistance value of about 0.1Ω.

On the other hand, the organic light emitting layer 140 can have a resistance value of about 1 MΩ. Therefore, when a short circuit preventing resistance is not provided, the resistance of the organic light emitting layer 140 can be much higher than those of the first electrode 130 and the second electrode 150, and thus a total resistance of the respective pixels can be substantially the same as that of the organic light emitting layer 140.

On the other hand, as shown in FIG. 4, in the OLED lighting apparatus 100 according to the second embodiment of the present disclosure, even when the first electrode 130 and the second electrode 150 of one pixel of the plurality of pixels of the OLED E are in contact with each other and short-circuited, the resistance of the organic light emitting layer 140 can be removed from the short-circuited pixel, and only the resistance caused by the transparent conductive material having a high resistance of the first electrode 130 and the resistance of the second electrode 150 may remain therein.

That is, in the second embodiment of the present disclosure, the first electrode 130 can have a resistance value of 1,000 to 20,000Ω, and the organic light emitting layer 140 can have a resistance value of about 1 MΩ. Thus, even when the resistance of the organic light emitting layer 140 is removed from the pixel short-circuited by the contact between the first electrode 130 and the second electrode 150, the resistance of the first electrode 130 made of a high resistive film may remain in the short-circuited pixel, and this resistance is not negligibly low in comparison to the total resistance of the other pixels.

Therefore, even when the pixel is short-circuited by the contact between the first electrode 130 and the second electrode 150, the resistance of the OLED E of the short-circuited pixel can be removed, and accordingly the resistance value of the pixel can become zero. Thus, the total resistance of the short-circuited pixel can be substantially the same as the resistance of the first electrode 130.

Here, the resistance of the first electrode 130 can have a significant degree of magnitude in comparison to the resistance of the organic light emitting layer 140. Therefore, most current between of the first electrode 130 and the second electrode 150 may not flow through the short-circuited pixel, but a certain amount of current may flow through the other pixels. At this time, the current flowing through the short-circuited pixel can be different from those flowing through the other pixels in terms of an amount because the total resistance of the short-circuited pixel can be different from that of the other pixels, but the current may flow through all pixels, thereby preventing a sharp decrease in the luminance of the organic light emitting layer 140 of the plurality of pixels or an emission failure.

As a result, the OLED lighting apparatus 100 according to the second embodiment of the present disclosure may prevent a sharp decrease in the luminance due to a short circuit of a pixel without forming an opening and a resistive pattern in the first electrode 130 by using the high resistive film having a high resistance value of 1,000 to 20,000Ω as the first electrode 130 disposed between the auxiliary wiring 120 and the protective layer 125, thereby preventing an increase in cost or a reduction in yield resulting from the addition of a process.

Also, since the OLED lighting apparatus 100 according to the second embodiment of the present disclosure uses the high resistive film having a high resistance value of 1,000 to 20,000Ω as the first electrode 130 disposed between the auxiliary wiring 120 and the protective layer 125, it is not necessary to form an opening and a resistive pattern in the first electrode 130, thereby preventing a reduction in the aperture ratio resulting from formation of the opening and the resistive pattern.

As described above, the OLED lighting apparatus 100 according to the second embodiment of the present disclosure may solve a problem of a reduction in the aperture ratio by using the high resistive film having a high resistance value of 1,000 to 20,000Ω as the first electrode 130 disposed between the auxiliary wiring 120 and the protective layer 125, but may cause a change in the film quality characteristics of the first electrode 130 during a process of forming the protective layer 125 on the first electrode 130 made of the high resistive film which can be introduced to improve the aperture ratio.

Figure 5:
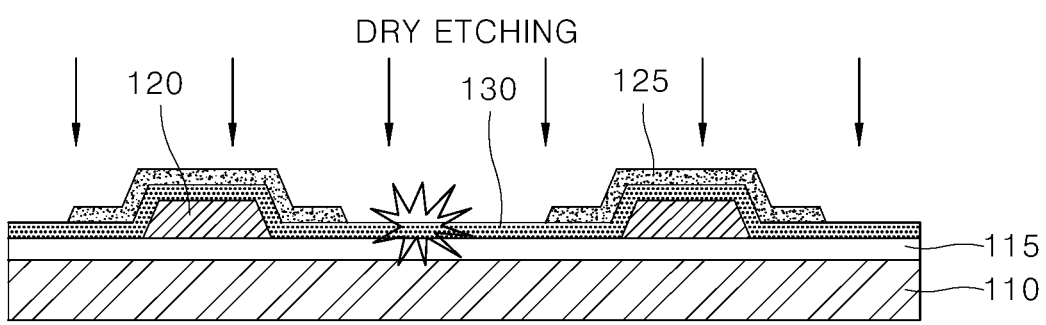
FIG. 5 is a mimetic diagram illustrating a process of manufacturing the OLED lighting apparatus according to the second embodiment of the present disclosure.

FIG. 5 is a mimetic diagram illustrating a process of manufacturing the OLED lighting apparatus according to the second embodiment of the present disclosure, and the manufacturing process will be described in detail with reference to FIG. 5.

As shown in FIG. 5, in order to manufacture the OLED lighting apparatus 100 according to the second embodiment of the present disclosure, the buffer layer 115 and the auxiliary wiring 120 can be formed on the substrate 110, and then first electrode 130 made of the high resistive film having a high resistance value of 1,000 to 20,000Ω can be formed on the auxiliary wiring 120 and the buffer layer 115.

Thereafter, a protective film material can be deposited on an entire upper surface of the first electrode 130, and then the protective layer 125 can be formed so as to cover the auxiliary wiring 120 by patterning the protective film material by means of a dry etching method using a photomask that selectively covers only an area where the protective layer can be formed.

However, when a dry etching process is performed to form the protective layer 125, since first electrode 130 made of the high resistive film may include a SiOx-based binder substantially the same as the protective film material, the first electrode made of the high resistive film can be damaged during the process of patterning the protective film material by means of the dry etching method.

As a result, there was a problem that the thickness of the first electrode 130 can be below a predetermined value, or a change in the film quality characteristics (surface roughness, resistance, and the like) of the first electrode 130 degrades the reliability of the OLED lighting apparatus.

In order to solve this problem, a first electrode having a double-layered structure can be introduced to an OLED lighting apparatus according to a third embodiment of the present disclosure. A first layer of the first electrode can be made of a transparent conductive material having low resistance to generate a current path, and a second layer of the first electrode can be disposed on a protective layer configured to cover an auxiliary wiring and the first layer of the first electrode, and be made of a transparent conductive material having high resistance.

As a result, the first layer of the first electrode made of a transparent conductive material having low resistance can be disposed under the protective layer, and thus film quality characteristics may remain unchanged. Besides, the OLED lighting apparatus according to the third embodiment of the present disclosure may implement a function of preventing a short circuit by means of the second layer of the first electrode having high resistance disposed on the first layer of the first electrode and the protective layer, and thus it is not necessary to design an additional short circuit preventing resistance circuit, thereby improving an aperture ratio.

The OLED lighting apparatus according to the third embodiment of the present disclosure will be described in detail with reference to the accompanying drawings.

Figure 6:
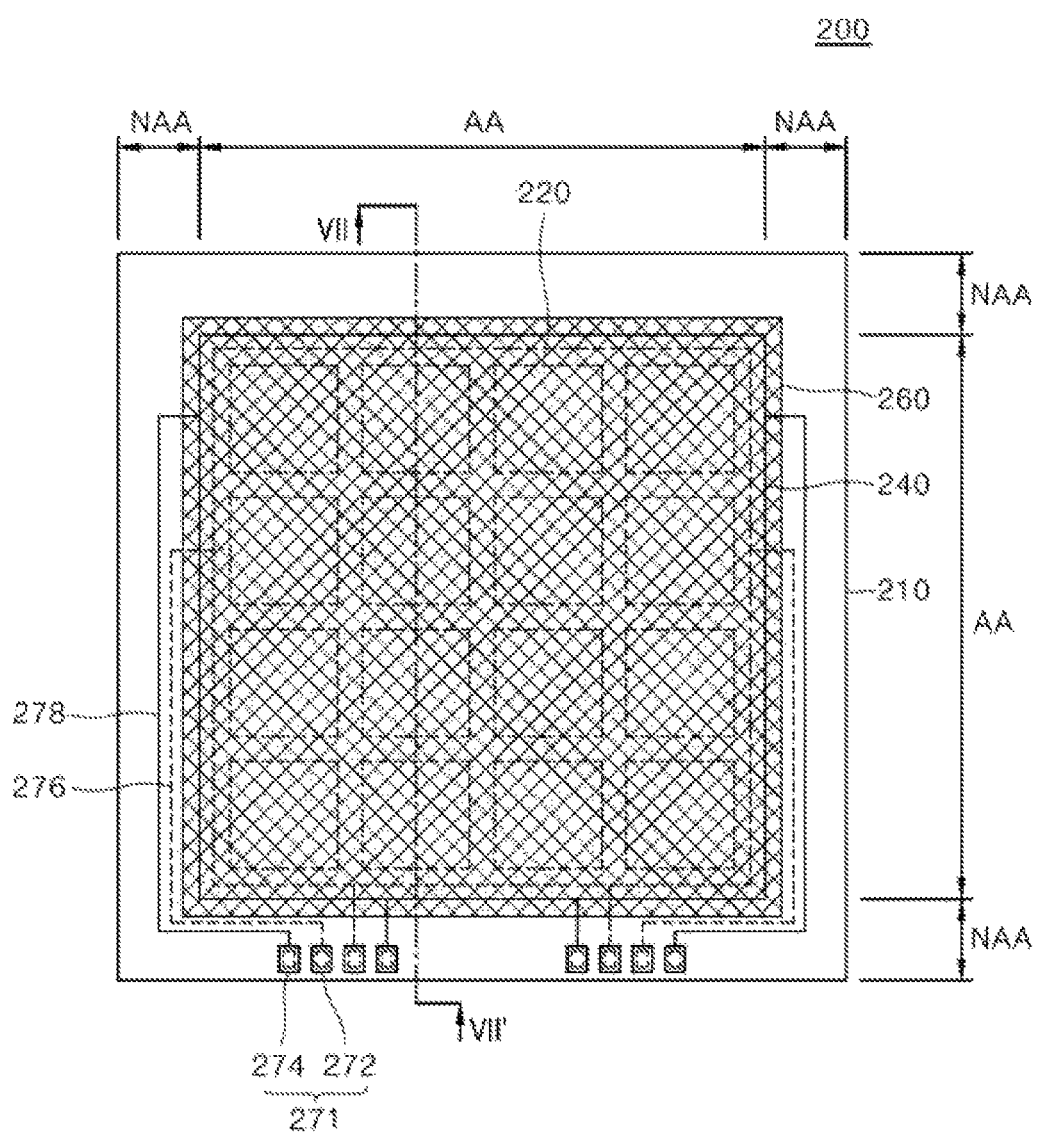
FIG. 6 is a plan view of an OLED lighting apparatus according to a third embodiment of the present disclosure.
Figure 7:
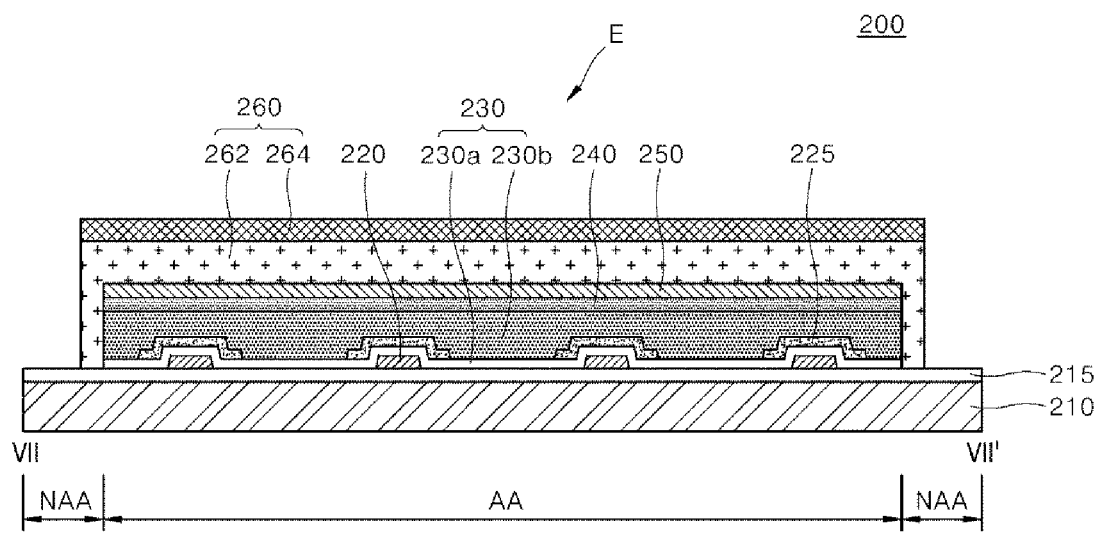
FIG. 7 is a cross-sectional view taken along line VII-VII' of FIG. 6.

FIG. 6 is a plan view of the OLED lighting apparatus according to the third embodiment of the present disclosure, and FIG. 7 is a cross-sectional view taken along line VII-VII' of FIG. 6.

Referring to FIGS. 6 and 7, an OLED lighting device 200 according to the third embodiment of the present disclosure may include a substrate 210, an auxiliary wiring 220, a protection layer 225, a first electrode 230, an organic light emitting layer 240 and a second electrode 250. The OLED lighting device 200 and/or the substrate 210 can include one or more active area AA and one or more non-active area NAA.

The substrate 210 can be made of a transparent material such as a glass material. Alternatively, the substrate 210 can be made of a polymer material having a flexible characteristic. Pads 271, including first and second pads 272 and 274 can be formed on the substrate 210, and be connected to the first and second pad wirings 276 and 278.

The auxiliary wiring 220 may disposed on the substrate 210. At this time, a buffer layer 215 can be further disposed between the substrate 210 and the auxiliary wiring 220. The buffer layer 215 may serve to shield permeation of moisture and air from a bottom portion of the substrate 210. For this purpose, the buffer layer 215 can be made of an inorganic material such as SiOx, SiNx, or the like.

The auxiliary wiring 220 can be arranged in a matrix form on the substrate 210 to divide the substrate 210 into a plurality of pixels and allow a uniform voltage to be applied to the first electrode 230, whereby the large OLED lighting apparatus 100 may emit light with a uniform luminance. For this purpose, the auxiliary wiring 220 can be made of any one selected from Al, Au, Cu, Ti, W, Mo and Cr, or alloys thereof. The auxiliary wiring 220 can have a single-layered structure or a multi-layered structure.

Since the auxiliary wiring 220 can have a much lower resistance than the first electrode 230, a voltage for the first electrode 230 can be applied to the first electrode 230 through the auxiliary wiring 220 rather than being directly applied to the first electrode 230. Therefore, the first electrode 230 formed over the entire substrate 210 can be divided into the plurality of pixels by the auxiliary wiring 220.

The protective layer 225 can be formed so as to surround the auxiliary wiring 220. The protective layer 225 can be made of an inorganic material such as SiOx, SiNx, or the like.

The first electrode 230 can be disposed between the auxiliary wiring 220 and the protection layer 225 to be in direct contact with the auxiliary wiring 220. The first electrode 230 may include a first layer 230a having a first resistance, and a second layer 230b configured to cover the first layer 230a and the protective layer 225 and having a second resistance higher than the first resistance.

The first layer 230a of the first electrode 130 can be made of a transparent conductive material including any one selected from ITO, indium zinc oxide (IZO) and indium tin zinc oxide (ITZO) which has a relatively good conductivity, and accordingly the first resistance can have a low resistance value of approximately 10 to 700Ω.

The second layer 230b of the first electrode 230 may cover entire upper portions of the first layer of the first electrode and the protective layer, and have a flat surface.

The second layer 230b of the first electrode 230 may include a binder and a conductive material.

The binder may include at least one selected from TEOS, SSQ and polysiloxane.

The conductive material may include at least one selected from PEDOT, a CNT, graphene, a Cu-nanowire, an Ag-nanowire and an Au-nanowire. Other conductive materials can be used.

At this time, the second layer 230b of the first electrode 230 may secure high resistance having a value of approximately 5,000 to 30,000Ω by controlling an amount of the conductive material to be added to the binder in an optimum content ratio. That is, the resistance of the second layer 230b of the first electrode 230 can be controlled to be higher than that of the first electrode 130 of the second embodiment (130 of FIG. 4) so as to adjust the sum of the first resistance and the second resistance to approximately 1,000 to 20,000Ω.

For this purpose, the second layer 230b of the first electrode 230 may preferably include 5 to 30 parts by weight of the conductive material with respect to 100 parts by weight of the binder. When an amount of the conductive material is less than approximately 5 parts by weight with respect to 100 parts by weight of the binder, the amount of the conductive material to be added is insufficient, which may result in a loss of conductivity. Conversely, when the amount of the conductive material is more than 30 parts by weight with respect to 100 parts by weight of the binder, the resistance of the second layer 230b can be reduced due to an excessive addition of the conductive material, and thus it can be difficult to secure high a resistance having a value of approximately 5,000 to 30,000Ω.

In addition, the second layer 230b of the first electrode 230 may further include an additive such as a leveling agent and a surface agent. Such an additive can be added in an amount of 2 parts by weight or less with respect to 100 parts by weight of the binder.

As shown in FIGS. 3 and 4, according to the first and second embodiments of the present disclosure, the protective layer 125 may partially reduce a step coverage caused by the auxiliary wiring 120, but it can be difficult to completely remove or compensate the step coverage caused by the auxiliary wiring 120. As a result, the organic light emitting layer 140 and the second electrode 150 stacked on the first electrode 130 can be disconnected.

On the other hand, as shown in FIGS. 6 and 7, in the OLED lighting apparatus 200 according to the third embodiment of the present disclosure, the second layer 230b of the first electrode 230 can be coated so as to cover entire upper portions of the first layer 230a of the first electrode 230 and the protective layer 225, and have a flat surface such that the step coverage caused by the auxiliary wiring 220 can be completely removed or compensated, thereby preventing a disconnection malfunction of the organic light emitting layer 240 and the second electrode 250 caused by the step coverage. The flat surface of the second layer 230b of the first electrode 230 can be parallel to a flat surface of the substrate 210. The the organic light emitting layer 240 and the second electrode 250 can each have a flat surface that is parallel to the flat surface of the substrate 210 and the flat surface of the second layer 230b of the first electrode 230.

The organic light emitting layer 240 can be disposed on the first electrode 230, and the second electrode 250 can be disposed on the organic light emitting layer 240.

The organic light emitting layer 240 can be made of an organic light emitting material that emits white light. For example, the organic light emitting layer 240 can be composed of a blue organic light emitting layer, a red organic light emitting layer, and a green organic light emitting layer. Alternatively, the organic light emitting layer 240 can have a tandem structure including a blue light emitting layer and a yellow-green light emitting layer. However, it should be understood that the organic light emitting layer 240 of the present disclosure is not limited thereto and can be configured in various forms and includes other variations.

The OLED E may further include: an electron injection layer and a hole injection layer which inject electrons and holes into the organic light emitting layer 240, respectively; an electron transport layer and a hole transport layer which transport injected electrons and holes to the organic light emitting layer 240, respectively; and a charge generation layer which generates charges such as electrons and holes.

The organic light emitting layer 240 can be made of a material that emits light in a visible light area by receiving holes and electrons from the hole transporting layer and the electron transporting layer, respectively and combining them. In this instance, an organic material having excellent quantum efficiency for fluorescence or phosphorescence can be used. The organic material can be, for example, a 8-hydroxy-quinoline aluminum complex (Alq3), a carbazole-based compound, a dimerized styryl compound, a bis-methyl-8-hydroxyquinoline paraphenylphenol aluminum complex (Balq), a 10-hydroxybenzoquinoline-metal compound, benzoxazole, benzthiazole and benzimidazole-based compounds, an anthracene-based compound, a pyrene-based compound, a poly(p-phenylenevinylene) (PPV)-based polymer, a spiro compound, polyfluorene, and lubrene, but is not limited thereto, and includes other variations.

The second electrode 250 can be made of metal such as Ca, Ba, Mg, Al, or Ag, or an alloy thereof.

At this time, the first electrode 230, the organic light emitting layer 240, and the second electrode 250 may constitute the OLED E. In this instance, when voltage is applied to the first electrode 230 which can be an anode of the OLED E and the second electrode 250 which can be a cathode of the OLED E, an electron and a hole can be respectively injected from the second electrode 250 and the first electrode 230 into the organic light emitting layer 240 to generate an exciton in the organic light emitting layer 240. As the exciton decays, light corresponding to an energy difference between a LUMO and a HOMO of the organic light emitting layer 240 can be generated and emitted toward the substrate 210.

In addition, the OLED lighting apparatus 200 according to the third embodiment of the present disclosure may further include an encapsulation layer 260.

The encapsulation layer 260 can be disposed to cover an upper portion of the substrate 210 on which the OLED E can be disposed such that the OLED E can be sealed.

The encapsulation layer 260 may include an adhesive layer 262 and a base layer 264 disposed on the adhesive layer 262. In this way, the encapsulation layer 260 including the adhesive layer 262 and the base layer 264 can be disposed on the substrate 210 provided with the OLED E, and the base layer 264 can be adhered to the OLED E by the adhesive layer 262, and thereby it can be possible to seal the OLED lighting apparatus 200.

At this time, a photocurable adhesive or a thermosetting adhesive can be used as the adhesive layer 262. The base layer 264 arranged to prevent moisture or air from permeating from the outside can be made of any material as long as it is able to perform a function of preventing permeation of moisture or air. For example, the base layer 264 can be made of a polymer material such as PET, or a metal material such as an aluminum foil, a Fe—Ni alloy, a Fe—Ni—Co alloy, or the like.

In the OLED lighting apparatus 200 according to the third embodiment of the present disclosure, the buffer layer 215 and the auxiliary wiring 220 can be disposed on the substrate 210. Also, a first layer 230a of the first electrode 230 made of a transparent conductive material having relatively good conductivity such as ITO can be disposed on the auxiliary wiring 220 and the buffer layer 215, and a second layer 230b of the first electrode 230 made of a high resistive film having a high resistance value of approximately 5,000 to 30,000Ω can be disposed on the first layer 230a of the first electrode 230 and the protective layer 225. Accordingly, the first electrode 230 can have a double-layered structure including the first layer 230a and the second layer 230b.

At this time, the first layer 230a of the first electrode 230 made of a transparent conductive material having a low resistance value of approximately 10 to 700Ω can be disposed between the auxiliary wiring 220 and the protective layer 225. Therefore, even when a protective film material can be deposed on an entire surface of the first layer 230a of the first electrode 230, and then selective patterning can be performed on the protective film material by means of a dry etching method using a photomask, there is no fear of damage to the first layer 230a of the first electrode 230 since the first layer 230a of the first electrode 230 can be made of a transparent metal material different from the protective film material. Even though the first layer 230a of the first electrode 230 can be damaged, the damage may not cause a change in the film quality characteristics, thereby improving the reliability of the OLED lighting apparatus 200.

Further, since the second layer 230b of first electrode 230 made of the high resistive film having a high resistance value of approximately 5,000 to 30,000Ω can be disposed on the first layer 230a of the first electrode 230 and the protective layer 225 in the same manner as in the OLED lighting apparatus according to the second embodiment of the present disclosure, the sum of the first resistance and the second resistance can be adjusted to approximately 1,000 to 20,000Ω. As a result, the OLED lighting apparatus 200 according to the third embodiment of the present disclosure may prevent a sharp decrease in the luminance due to a short circuit of a pixel without forming an opening and a resistive pattern in the first electrode 230, thereby preventing an increase in cost or a reduction in yield resulting from the addition of a process.

The first layer 230a of the first electrode 230 made of a transparent conductive material having low resistance can be disposed under the protective layer, and thus film quality characteristics may remain unchanged. Besides, the OLED lighting apparatus 200 according to the third embodiment of the present disclosure may implement a function of preventing a short circuit by means of the second layer 230b of the first electrode 230 having a high resistance disposed on the first layer 230a of the first electrode 230 and the protective layer 225, and thus it is not necessary to design an additional short circuit preventing resistance circuit, thereby improving an aperture ratio.

Furthermore, the OLED light apparatus 200 according to the third embodiment of the present disclosure may completely remove or compensate the step coverage caused by the auxiliary wiring 220 since the second layer 230b of the first electrode 230 can be coated so as to completely cover entire upper portions of the first layer 230a of the first electrode 230 and the protective layer 224, and can have a flat surface, thereby preventing a disconnection malfunction of the organic light emitting layer 240 and the second electrode 250 caused by the step coverage.

Hereinafter, a method of manufacturing the OLED lighting apparatus according to the third embodiment of the present disclosure will be described with reference to the accompanying drawings.

FIGS. 8 to 12 are cross-sectional views of processes illustrated to explain the method of manufacturing the OLED lighting apparatus according to the third embodiment of the present disclosure.

Figure 8:
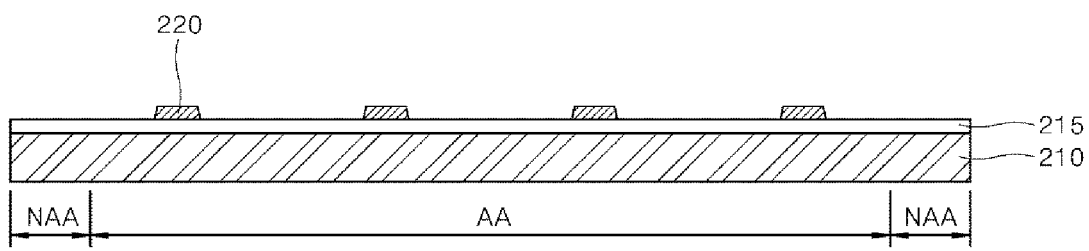
FIGS. 8 to 12 are cross-sectional views of processes illustrated to explain a method of manufacturing the OLED lighting apparatus according to the third embodiment of the present disclosure.

As shown in FIG. 8, after forming a metal layer by depositing a metal material including any one selected from Al, Au, Cu, Ti, W, Mo and Cr, or alloys thereof on the substrate 210, selective patterning using a photomask can be performed so as to form the auxiliary wiring 220 composed of a single layer or a plurality of layers. At this time, the auxiliary wiring 220 can be arranged in a matrix form over the entire substrate 210, but the matrix form is merely an example. The auxiliary wiring 220 can be arranged in a mesh shape, a hexagonal shape, an octagonal shape, a circular shape, or the like A buffer layer 215 can be further formed on the entire surface of the substrate 210 before the auxiliary wiring 220 can be formed. The buffer layer 215 may serve to shield permeation of moisture and air from a bottom portion of the substrate 210. For this purpose, the buffer layer 215 can be made of an inorganic material such as SiOx, SiNx, or the like.

Figure 9:
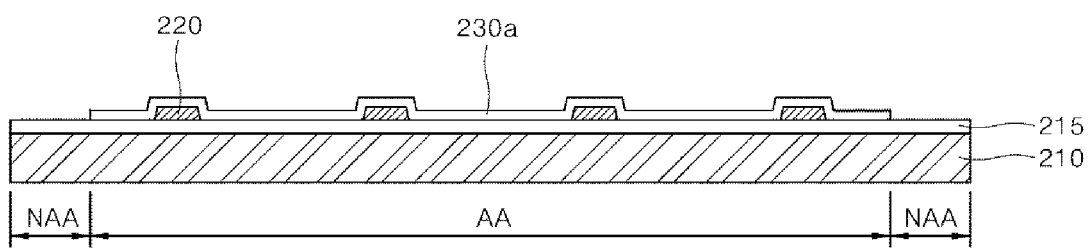

As shown in FIG. 9, the first layer 230a of the first electrode 230 can be formed by depositing a transparent conductive material including any one selected from ITO, IZO and ITZO which have relatively good conductivity on the substrate 210 where the auxiliary wiring 220 can be formed and performing selective patterning using a photomask. Accordingly, the first layer 230a of the first electrode 230 can be in directly contact with the auxiliary wiring 220, and have the first resistance having a low resistance value of approximately 10 to 700Ω.

Figure 10:
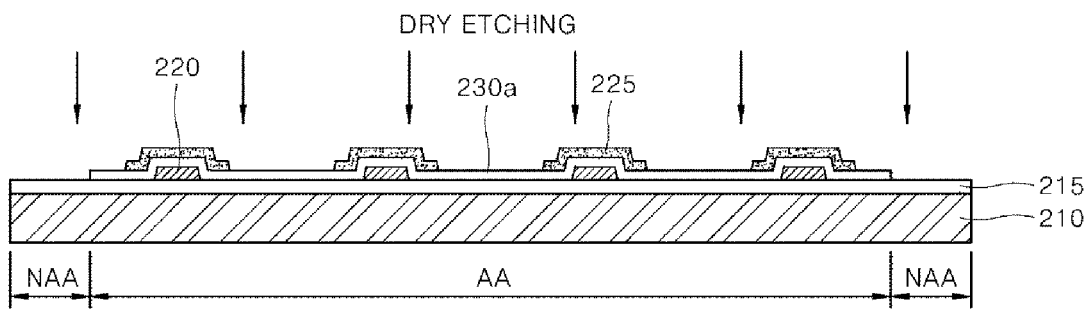

As shown in FIG. 10, a protective film material such as SiOx or SiNx can be deposited on the first layer 230a of the first electrode 230, and then the protective layer 225 can be formed so as to cover the auxiliary wiring 20 by patterning the protective film material by means of a dry etching method using a photomask that selectively covers only an area where the protective layer can be formed.

At this time, according to the third embodiment of the present disclosure, when selective patterning can be performed by means of the dry etching method using the photomask, there is no fear of damage to the first layer 230a of the first electrode 230 since the first layer 230a of the first electrode 230 can be made of a transparent metal material different from the protective film material. Even though the first layer 230a of the first electrode 230 can be damaged, the damage may not cause a change in the film quality characteristics, thereby improving the reliability of the OLED lighting apparatus 200.

Figure 11:
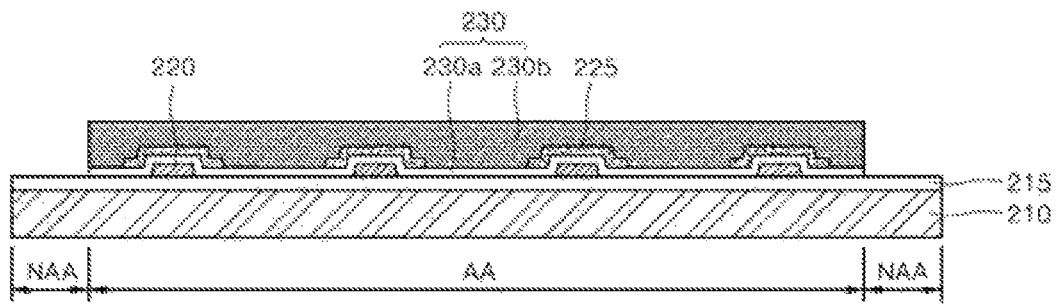

As shown in FIG. 11, a high resistive film having a second resistance higher than the first resistance can be applied on the substrate where the first layer 230a of the first electrode 230 and the protective layer 225 are formed, and be cured to form the second layer 230b of the first electrode 230.

At this time, the high resistive film may include a binder, a conductive material and a solvent. That is, the high resistive film can be applied on the substrate 210 in a liquid state where the binder and conductive material can be mixed with the solvent such as propylene glycol monomethylethylether acetate (PGMEA), and then can be solidified through a curing process. During the curing process, the solvent can be volatilized and removed.

The binder may include at least one selected from TEOS, SSQ and polysiloxane.

The conductive material may include at least one selected from PEDOT, a CNT, graphene, a Cu-nanowire, an Ag-nanowire and an Au-nanowire. Other conductive materials can be used.

At this time, the second layer 230b of the first electrode 230 may secure a high resistance having a value of approximately 5,000 to 30,000Ω by controlling an amount of the conductive material to be added to the binder in an optimum content ratio. At this time, it is possible to adjust the sum of the first resistance and the second resistance to approximately 1,000 to 20,000Ω by controlling the resistance of the second layer 230b of the first electrode 230 to have a high resistance value of approximately 5,000 to 30,000.

For this purpose, the second layer 230b of the first electrode 230 may preferably include approximately 5 to 30 parts by weight of the conductive material with respect to 100 parts by weight of the binder.

Figure 12:
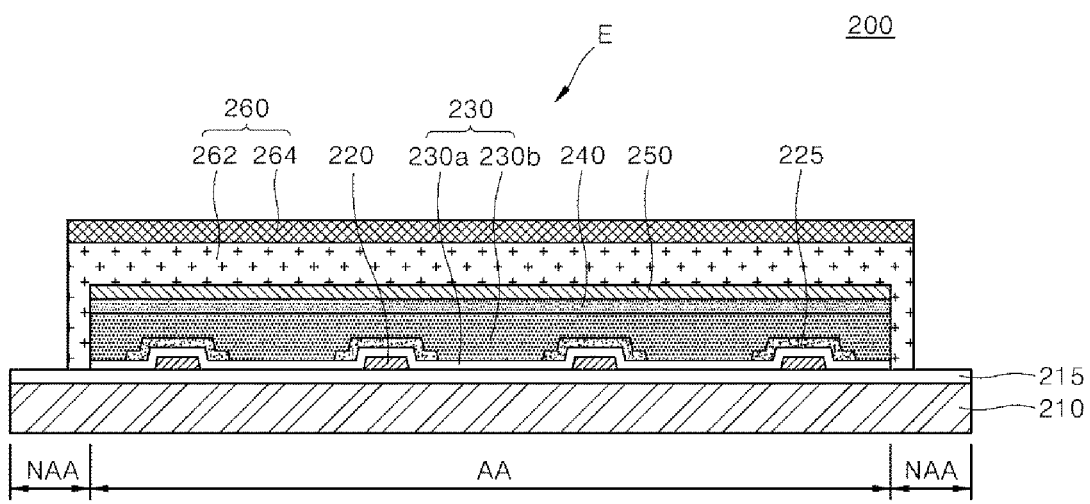

As shown in FIG. 12, after forming the organic light emitting layer 230 by depositing an organic light emitting material on the second layer 230b of the first electrode 230, metal such as Ca, Ba, Mg, Al and Ag can be deposited on the organic light emitting layer 240 and selectively etched to form the second electrode 250. The first electrode 230, the organic light emitting layer 240 and the second electrode 250 may constitute the OLED E.

Thereafter, an adhesive layer 262 can be formed by applying an adhesive made of a photocurable adhesive material or a thermosetting adhesive material on the substrate 210 where the OLED E can be formed, and then a base layer 264 can be disposed on the adhesive layer 262. In this state, the base layer 264 can be adhered to the OLED E by thermocompression to seal the OLED E formed on the substrate 210. At this time, the adhesive layer 262 and the base layer 264 may constitute the encapsulation layer 260.

Figure 13:
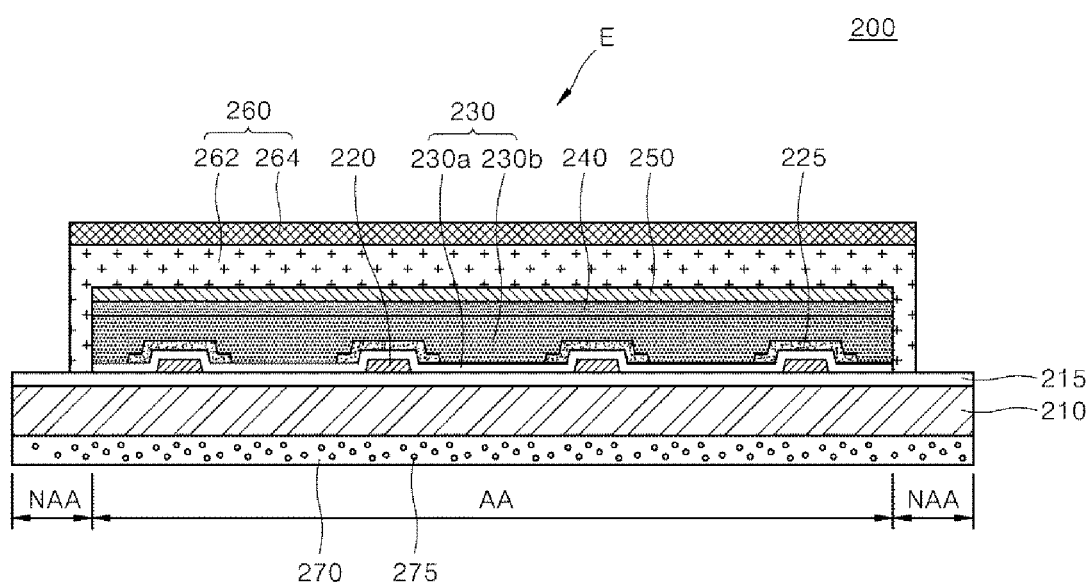
FIG. 13 is a cross-sectional view of an OLED lighting apparatus according to a modification of the third embodiment of the present disclosure.

FIG. 13 is a cross-sectional view of an OLED lighting apparatus according to a modification of the third embodiment of the present disclosure. The OLED lighting apparatus according to the modification of the third embodiment of the present disclosure can have the same configuration as that according to the third embodiment of the present disclosure, except that the OLED lighting apparatus according to the modification of the third embodiment further include a light extracting layer. Thus, the description of the same configuration will be omitted.

Referring to FIG. 13, the OLED lighting apparatus 200 according to the modification of the third embodiment of the present disclosure may further include a light extracting layer 270 disposed on a rear surface of the substrate 210.

The light extracting layer 270 can be disposed at a surface boundary between the substrate 210 and an external air layer to reduce reflection of light occurring at the surface boundary between the substrate 210 and the external air layer, thereby improving extraction efficiency of light emitted from the organic light emitting layer 240.

The light extracting layer 270 can be configured in various forms. For example, the light extracting layer 270 can be composed of a plurality of layers, and a refractive index of the plurality of light extracting layers 270 can be reduced from the substrate 210 toward the external air layer so as to reduce the angle of totally reflected light at the surface boundary between the substrate 210 and the external air layer, thereby improving light extraction efficiency.

The light extracting layer 270 may include light scattering particles 275 to scatter light incident at a surface boundary between the light extracting layer 270 and the external air layer, thereby minimizing light reflected at the surface boundary between the light extracting layer 270 and the external air layer.

For this purpose, the light scattering particles 275 can be randomly dispersed in the light extracting layer 270. At this time, light scattering particles with a high reflective index as the light scattering particles 275 can be used. Specifically, the light scattering particles 275 may include at least one selected from $TiO_2$, $BaTiO_3$, $ZrO_2$, ZnO, $SiO_2$ and SiO.

Therefore, the light extracting layer 270 can be configured in all currently known structures as long as it is able to improve the light extraction efficiency by minimizing reflection of light incident at the surface boundary between the light extracting layer 270 and the external air layer.

At this time, as shown in FIG. 13, the light extracting layer 270 can be attached to the rear surface of the substrate 210, but a location of the light extracting layer 270 is not limited thereto, and includes other variations. That is, the light extracting layer 270 can be also disposed between the substrate 210 and the buffer layer 215.

Therefore, in the OLED lighting apparatus 200 according to the modification of the third embodiment of the present disclosure, the light extracting layer 270 can be disposed on the rear surface of the substrate 210 which can be in contact with the external air layer so as to minimize light reflection occurring at the surface boundary between the substrate 210 and the external air layer, thereby improving the light extraction efficiency.

The present disclosure is described with reference to embodiments described herein and accompanying drawings, but is not limited thereto includes other variations. It should be apparent to those skilled in the art that various changes or modifications which are not exemplified herein but are still within the spirit and scope of the present disclosure can be made.

What is claimed is:

1. An organic light emitting diode (OLED) lighting apparatus, the OLED lighting apparatus comprising:
   a substrate;
   an auxiliary wiring disposed on the substrate;
   a protective layer disposed on the substrate and configured to cover the auxiliary wiring;
   a first electrode including a first layer and a second layer, the first layer being disposed between the auxiliary wiring and the protective layer to be in direct contact with the auxiliary wiring and having a first resistance, and the second layer covering the first layer and the protective layer and having a second resistance higher than the first resistance;
   an organic light emitting layer disposed on the first electrode; and
   a second electrode disposed on the organic light emitting layer,
   wherein the protective layer is disposed between the first layer and the second layer.

2. The OLED lighting apparatus of claim 1, wherein the first layer of the first electrode includes any one selected from indium tin oxide (ITO), indium zinc oxide (IZO), and indium tin zinc oxide (ITZO).

3. The OLED lighting apparatus of claim 1, wherein the first resistance has a resistance value of approximately 10 to 700 Ω,
   wherein the second resistance has a resistance value of approximately 5,000 to 30,000 Ω.

4. The OLED lighting apparatus of claim 3, wherein the first electrode as a whole has a resistance value of approximately 1,000 to 20,000.

5. The OLED lighting apparatus of claim 1, wherein the second layer of the first electrode is configured to cover entire upper portions of the first layer of the first electrode and the protective layer, and
   wherein the second layer has a flat surface.

6. The OLED lighting apparatus of claim 1, wherein the second layer of the first electrode includes approximately 5 to 30 parts by weight of a conductive material with respect to 100 parts by weight of a hinder.

7. The OLED lighting apparatus of claim 6, wherein the binder includes at least one selected from tetraethlyorthosilicate (TEOS), silsesquioxane (SSQ) and polysiloxane.

8. The OLED lighting apparatus of claim 6, wherein the conductive material includes at least one selected from poly(3,4-ethylenedioxythiophene) (PEDOT), a carbon nanotube (CNT), graphene, a Cu-nanowire, an Ag-nanowire and an Au-nanowire.

9. The OLED lighting apparatus of claim 1, further comprising a light extracting layer disposed between the substrate and a buffer layer, or on a rear surface of the substrate.

10. The OLED lighting apparatus of claim 9, wherein the light extracting layer includes light scattering particles.

11. The OLED lighting apparatus of claim 10, wherein the light scattering particles include at least one selected from $TiO_2$, $BaTiO_3$, $ZrO_2$, ZnO, $SiO_2$ and SiO.

12. The OLED lighting apparatus of claim 1, further comprising:
   a buffer layer disposed between the substrate and the auxiliary wiring; and
   an encapsulation layer disposed on the second electrode, the encapsulation layer configured to seal the first electrode, the organic light emitting layer and the second electrode that are stacked on the substrate.

* * * * *